(12) United States Patent
Amanuma

(10) Patent No.: US 9,057,756 B2
(45) Date of Patent: Jun. 16, 2015

(54) TEST APPARATUS

(75) Inventor: Seiji Amanuma, Saitama (JP)

(73) Assignee: ADVANTEST CORPORATION, Tokyo (JP)

( * ) Notice: Subject to any disclaimer, the term of this patent is extended or adjusted under 35 U.S.C. 154(b) by 208 days.

(21) Appl. No.: 13/292,091

(22) Filed: Nov. 9, 2011

(65) Prior Publication Data

US 2012/0153977 A1 Jun. 21, 2012

(30) Foreign Application Priority Data

Dec. 15, 2010 (JP) ................................. 2010-279691

(51) Int. Cl.
*G01R 31/08* (2006.01)
*G01R 31/02* (2006.01)
*G01R 31/26* (2014.01)

(52) U.S. Cl.
CPC .......... *G01R 31/2637* (2013.01); *G01R 31/261* (2013.01)

(58) Field of Classification Search
CPC .................... G01R 31/2637; G01R 31/261
USPC ........... 324/750.15, 762.01, 762.08, 522, 555
See application file for complete search history.

(56) References Cited

U.S. PATENT DOCUMENTS

| | | | | |
|---|---|---|---|---|
| 4,491,783 | A * | 1/1985 | Sawayama et al. ........... | 324/616 |
| 5,568,035 | A * | 10/1996 | Kato et al. ..................... | 320/166 |
| 7,298,150 | B2 * | 11/2007 | Amanuma ..................... | 324/522 |
| 2007/0216351 | A1 * | 9/2007 | Seki .............................. | 320/112 |
| 2007/0223156 | A1 | 9/2007 | Kumagi et al. | |
| 2009/0230978 | A1 * | 9/2009 | Kimura et al. ................ | 324/555 |
| 2010/0110742 | A1 * | 5/2010 | West .............................. | 363/132 |
| 2010/0271633 | A1 * | 10/2010 | Gomi ............................. | 356/448 |

FOREIGN PATENT DOCUMENTS

| | | |
|---|---|---|
| CN | 101042421 A | 9/2007 |
| JP | S63-120177 U | 8/1988 |
| JP | S64-053174 A | 3/1989 |
| JP | H02-33372 U | 3/1990 |
| JP | H02-244593 A | 9/1990 |
| JP | H3-29964 Y2 | 6/1991 |
| JP | H08-130085 A | 5/1996 |
| JP | H08-308092 A | 11/1996 |
| JP | 2000-58820 A | 2/2000 |
| JP | 2001-141789 A | 5/2001 |
| JP | 2007-258378 A | 10/2007 |

OTHER PUBLICATIONS

Notice of Reasons for Rejection of Japanese Patent Application No. 2010-279691, issued by the Japanese Patent Office on Dec. 24, 2013.
Notice of Office Action for Chinese Patent Application No. 201110403993.3, issued on Jun. 25, 2014.
Notice of Office Action for Taiwanese Patent Application No. 100139643, issued by the Taiwan Patent Office on Jul. 24, 2014.

* cited by examiner

*Primary Examiner* — Melissa Koval
*Assistant Examiner* — Farhana Hoque

(57) ABSTRACT

To prevent an excessive current from flowing through a device under test. A test apparatus that tests a device under test, comprising a power supply section that generates a power supply voltage to be supplied to the device under test; an inductive load section that is provided in a path leading from the power supply section to the device under test; a first semiconductor switch that is provided in the path leading from the inductive load section to the device under test and is connected in parallel with the device under test; and a control section that turns the first semiconductor switch ON when supply of the power supply voltage to the device under test is stopped.

11 Claims, 5 Drawing Sheets

TEST APPARATUS

BACKGROUND

1. Technical Field

The present invention relates to a test apparatus.

2. Related Art

A known switching device used in a large-current circuit is a device that uses an element such as an insulated-gate bipolar transistor (referred to hereinafter as an IGBT). In such a device, a plurality of IGBT elements are arranged in parallel according to the desired current specifications, as shown in Patent Document 1, for example. A test apparatus that tests this device supplies power from a common power supply to the IGBTs.

Patent Document 1: Japanese Patent Application Publication No. 2000-58820

One type of test for a large-current switching device is an avalanche breakdown test. In an avalanche breakdown test, the device under test is connected to an inductive load, such as an inductor, and electrical energy is accumulated in the inductive load while the device under test is in a conductive state. After this, the device under test is switched to a non-conductive state and the electrical energy accumulated in the inductive load is applied to the device under test, thereby testing the tolerance of the device under test.

The current flowing through the device under test as a result of a voltage exceeding the rated value of the device under test being applied thereto while the device under test is in a non-conductive state is referred to as the "avalanche current." The period during which the avalanche current flows is referred to as the "avalanche period." The voltage applied to the device under test during the avalanche period is referred to as the "avalanche voltage."

When the device under test malfunctions in a short circuit mode during the avalanche period, an excessive current flows through the device under test. When an excessive current flows through the device under test, damage spreads in the device under test and it becomes difficult to analyze the cause of the malfunction of the device under test. Furthermore, the excessive current can damage the test apparatus. In order to prevent damage to the device under test and the test apparatus, it is very important that, when the device under test malfunctions, the current from the inductive load be quickly prevented from flowing through the device under test by using a switch, for example.

SUMMARY

In order to solve the above problems, provided is a test apparatus that tests a device under test, comprising a power supply section that generates a power supply voltage to be supplied to the device under test; an inductive load section that is provided in a path leading from the power supply section to the device under test; a first semiconductor switch that is provided in the path leading from the inductive load section to the device under test and is connected in parallel with the device under test; and a control section that turns the first semiconductor switch ON when supply of the power supply voltage to the device under test is stopped.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
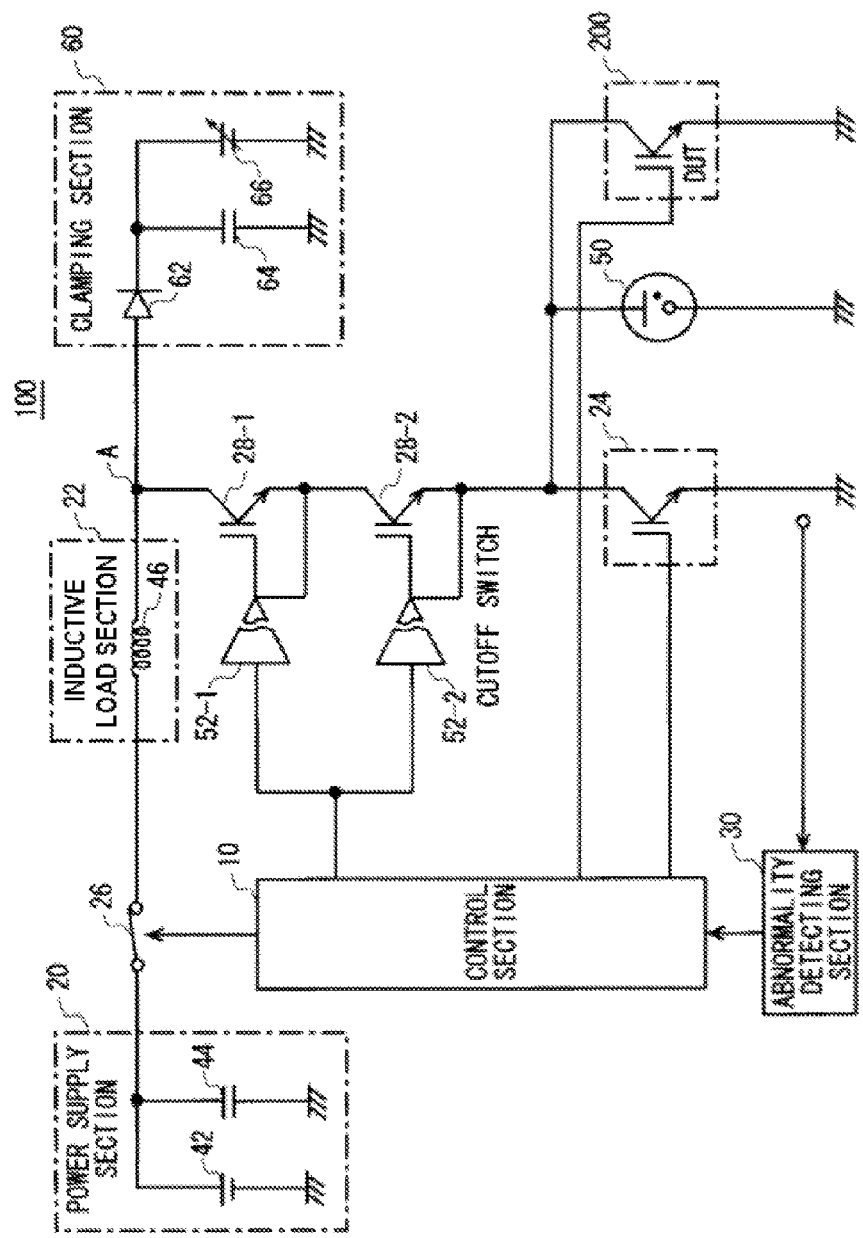
FIG. 1 shows an exemplary configuration of a test apparatus 100 that tests a device under test 200, together with the device under test 200.

FIG. 1 shows an exemplary configuration of a test apparatus 100 that tests a device under test 200, together with the device under test 200. The device under test 200 includes a switching element with high withstand voltage and a large current, such as an isolated-gate bipolar transistor (IGBT). The device under test 200 may include a plurality of switches formed in parallel on a common substrate.

The device under test 200 has a withstand voltage in a range from hundreds of volts to thousands of volts, and may be a device that can have a current from several amperes to several hundred amperes flow therethrough. The device under test 200 may be a device used in an automobile.

The test apparatus 100 includes a control section 10, a power supply section 20, an inductive load section 22, a first semiconductor switch 24, a second semiconductor switch 26, third semiconductor switches 28-1 and 28-2, an abnormality detecting section 30, a discharge tube 50, an isolated amplifier 52, and a clamping section 60. The control section 10 controls each component of the test apparatus 100. The control section 10 may supply a signal to each component of the test apparatus 100, or may receive a signal from each component.

The control section 10 may control each component according to a program provided by a user of the test apparatus 100. The control section 10 supplies the device under test 200 with a test signal that causes the device under test 200 to operate. For example, the control section 10 may generate a test signal that turns a switching element in the device under test 200 ON and OFF. The test apparatus 100 may judge pass/fail of the device under test 200 based on voltage or current applied to the device under test 200 according to the test signal, or based on voltage or current output from the device under test 200. For example, the test signal supplied by the control section 10 may be applied to a gate terminal of the switching device in the device under test 200.

The power supply section 20 includes a voltage source 42 and a capacitor 44, and generates a power supply voltage to be supplied to the device under test 200. The inductive load section 22 is provided in the path from the power supply section 20 to the device under test 200. The power supply voltage supplied by the power supply section 20 is applied to an emitter terminal or a collector terminal (or to a source terminal or a drain terminal) of the switching device via the inductive load section 22. The power supply section 20 supplies the emitter-collector current of the switching section. The power supply section 20 generates a power supply voltage designated according to the specifications of the device under test 200. For example, the power supply section 20 may generate a DC power supply voltage from 600 V to 1000 V.

The inductive load section 22 has an inductance and is provided in the path between the power supply section 20 and the device under test 200. The inductive load section 22 may be an inductor 46, for example. The inductive load section 22 may include a plurality of inductors 46 with different inductances that are switched such that one inductor is connected to the path. In this way, the inductive load section 22 can provided an inductance corresponding to the testing content and the type of the device under test 200 in the path between the power supply section 20 and the device under test 200. When the device under test 200 transitions from the ON state to the OFF state, the inductive load section 22 causes a back electromotive force. The test apparatus 100 of the present embodiment may test the withstand voltage of the device under test 200 using the back electromotive force generated by the inductive load section 22.

The first semiconductor switch 24 is connected to the inductive load section 22 in parallel with the device under test 200. In the present embodiment, the emitter terminal of the first semiconductor switch 24 is connected to the emitter terminal of the switching element of the device under test 200, and the collector terminal of the first semiconductor switch 24 is connected to the collector terminal of the switching device of the device under test 200. The first semiconductor switch 24 is turned ON and OFF under the control of the control section 10. The first semiconductor switch 24 is turned ON by the control section 10 when the supply of power supply voltage to the device under test 200 is stopped, and may be connected between the collector and emitter of the device under test 200. The inductive load section 22 generates the back electromotive force when the second semiconductor switch 26 is OFF and the supply of the power supply voltage is stopped, and when an excessive current is detected between the emitter and collector of the device under test 200, the control section 10 turns ON the first semiconductor switch 24, causing the first semiconductor switch 24 to have a low resistance and causing current to flow through the first semiconductor switch 24. In this way, an excessive current is prevented from flowing through the device under test 200.

The first semiconductor switch 24 may be an IGBT. The first semiconductor switch 24 preferably has a larger allowable current than the device under test 200. Furthermore, the allowable current of the first semiconductor switch 24 is preferably greater than the current that can be supplied to the device under test 200 by the power supply section 20. When the allowable current of the first semiconductor switch 24 is sufficiently large, current can be reliably prevented from flowing when the power supply voltage is stopped. The first semiconductor switch 24 preferably has an ON resistance that is less than the ON resistance of the device under test 200. When the ON resistance of the first semiconductor switch 24 is less than that of the device under test 200, even if the device under test 200 malfunctions in the short circuit mode when the power supply voltage is stopped, the majority of the current flowing from the inductive load section 22 toward the device under test 200 and the first semiconductor switch 24 flows through the first semiconductor switch 24, thereby preventing damage caused by an excessive current flowing through the device under test 200.

The discharge tube 50 is connected in parallel with the device under test 200. The discharge tube 50 clamps the voltage applied to the device under test 200. The discharge tube 50 discharges when the voltage applied to the device under test 200 reaches a prescribed value, thereby preventing an excessive current from being applied to the device under test 200.

The clamping section 60 is connected to a node, i.e. connection point A, that is connected to a terminal of the inductive load section 22 on the device under test 200 side, and clamps the voltage such that the voltage of the node does not exceed a prescribed voltage value. The clamping section 60 may include a diode 62, a capacitor 64, and a clamp voltage setting section 66. The anode of the diode 62 is connected to the node that is connected to the terminal of the inductive load section 22 on the device under test 200 side, and the cathode of the diode 62 is connected to one end of the capacitor 64 and the clamp voltage setting section 66. The other end of the capacitor 64 is connected to a reference potential, such as a ground potential. The clamp voltage setting section 66 outputs a voltage $V_{Clamp}$ to be used for the voltage clamping. When the potential of the anode of the diode 62, i.e. the potential of the node connected to the terminal of the inductive load section 22 on the device under test 200 side, is greater than the voltage output by the clamp voltage setting section 66, current flows forward in the diode 62 and the increase of the potential of the anode is restricted. The clamp voltage setting section 66 may be set such that the potential of the anode does not exceed a prescribed voltage, in light of the forward voltage drop of the diode 62.

The second semiconductor switch 26 is provided between the power supply section 20 and the inductive load section 22, and provides a connection or a disconnection between the power supply section 20 and the inductive load section 22. The second semiconductor switch 26 is turned ON and OFF under the control of the control section 10. The second semiconductor switch 26 provides a connection between the power supply section 20 and the inductive load section 22 during testing, and provides a disconnection between the power supply section 20 and the inductive load section 22 when testing is not being performed. The second semiconductor switch 26 may be a semiconductor switch, such as a relay or IGBT.

One or more third semiconductor switches 28-1 and 28-2 are connected to the inductive load section 22 in series with the device under test 200 in the path between the inductive load section 22 and the device under test 200. The number of third semiconductor switches is not limited to 2, and one, three, or more third semiconductor switches may be connected in series. The third semiconductor switches 28-1 and 28-2 are turned ON and OFF under the control of the control section 10. In the present embodiment, the third semiconductor switches 28-1 and 28-2 are connected in the path between the terminal of the inductive load section 22 on the side that is not connected to the power supply section 20 and the collector of the device under test 200, which is an IGBT. When the supply of the power supply voltage to the device under test 200 is stopped, the control section 10 turns OFF the third semiconductor switches 28-1 and 28-2. The third semiconductor switches 28-1 and 28-2 disconnect the device under test 200 from the inductive load section 22 when an abnormality occurs. The switching speed of a semiconductor switch is higher when the withstand voltage is lower, and therefore, in order to quickly stop the supply of the power supply voltage to the device under test 200, the withstand voltages of the third semiconductor switches 28-1 and 28-2 may be less than the withstand voltage of the device under test 200.

An isolated amplifier 52 is provided for each of the third semiconductor switches 28-1 and 28-2. Each isolated amplifier 52 turns the corresponding third semiconductor switch 28-1 or 28-2 ON and OFF according to a control signal received from the outside. In the present embodiment, each isolated amplifier 52 controls the gate voltage of the corresponding third semiconductor switch 28-1 or 28-2, which are IGBTs, to turn ON, i.e. connect, the collector-emitter junction and turn OFF, i.e. disconnect, the collector-emitter junction.

Each isolated amplifier 52 insulates the corresponding third semiconductor switch 28-1 or 28-2 from an external circuit that outputs the control signal. In this way, the isolated amplifiers 52 can prevent the high voltage that is supplied from the power supply section 20 to the device under test 200 from being supplied to the external circuit that outputs the control signal.

The abnormality detecting section 30 detects whether the test apparatus 100 is operating abnormally. For example, the abnormality detecting section 30 may detect that an abnormal voltage is generated or that an abnormal current is flowing through the device under test 200. As another example, the abnormality detecting section 30 may detect abnormal operation to be when the temperature of the device under test 200 exceeds a predetermined value. When there is an abnormality in the testing, the control section 10 may control the first to third semiconductor switches to stop the supply of the power supply voltage to the device under test 200. In this way, the control section 10 can prevent damage to the device under test 200 itself and to other devices resulting from the device under test being affected by unexpected environmental factors.

Figure 2:
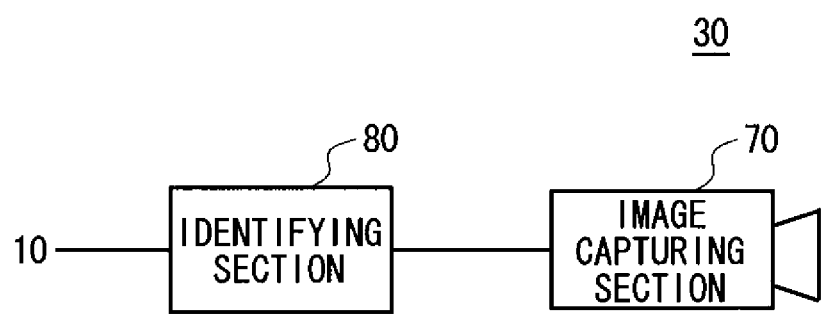
FIG. 2 shows a configuration of the abnormality detecting section 30 according to the present embodiment.

FIG. 2 shows a configuration of the abnormality detecting section 30 according to the present embodiment. The abnormality detecting section 30 includes an image capturing section 70 and an identifying section 80. The image capturing section 70 captures an image of the device under test 200, using a camera that detects a temperature distribution of a subject. For example, the image capturing section 70 may capture an image of a wafer on which a plurality of the devices under test 200 are formed, and detect the temperature of each device under test 200 on the wafer. The identifying section 80 identifies switching devices that are malfunctioning, among the switching devices included in the devices under test 200, according to the temperature distribution acquired from the image captured by the image capturing section 70. If each device under test 200 includes a plurality of switching elements, the positions of switching elements affected by abnormal temperature can be identified by measuring the temperature distribution of the device under test 200 using the image capturing section 70.

When the image capturing section 70 captures an image of a wafer on which a plurality of the devices under test 200 are formed, the identifying section 80 may identify the devices under test 200 that include malfunctioning switching elements based on the temperature distribution of the wafer. For example, the identifying section 80 may identify, as a malfunctioning switching element, any switching element that is within a prescribed distance from a location at which the temperature exceeds a prescribed reference value. With this configuration, when testing a plurality of devices under test 200 contained in a wafer in parallel, the test apparatus 100 can detect temperature abnormalities across a wide range of the wafer and can identify regions in which temperature abnormalities are likely to damage the devices under test 200. The identifying section 80 may notify the control section 10 concerning switching elements that are within a prescribed distance of locations at which the temperature exceeds the reference value, and the control section 10 may stop the supply of the power supply voltage to the switching elements indicated in the notification.

The image capturing section 70 may capture an image of the devices under test 200 through a pad arranged above the devices under test 200. In this case, the identifying section 80 may identify the malfunctioning devices under test 200 according to the acquired temperature distribution. A pad arranged above the devices under test 200 may be provided for each switching element in a device under test 200, or a single pad may be provided in common for a plurality of elements. By using the image capturing section 70 to capture the image of the devices under test 200 from a pad arranged above the devices under test 200, the temperature abnormalities can be identified with a certain degree of accuracy without exposing the elements under the pad. Furthermore, by providing a pad corresponding to each switching element in the devices under test 200, the identifying section 80 can identify whether each individual switching element is affected by a temperature abnormality.

Figure 3:
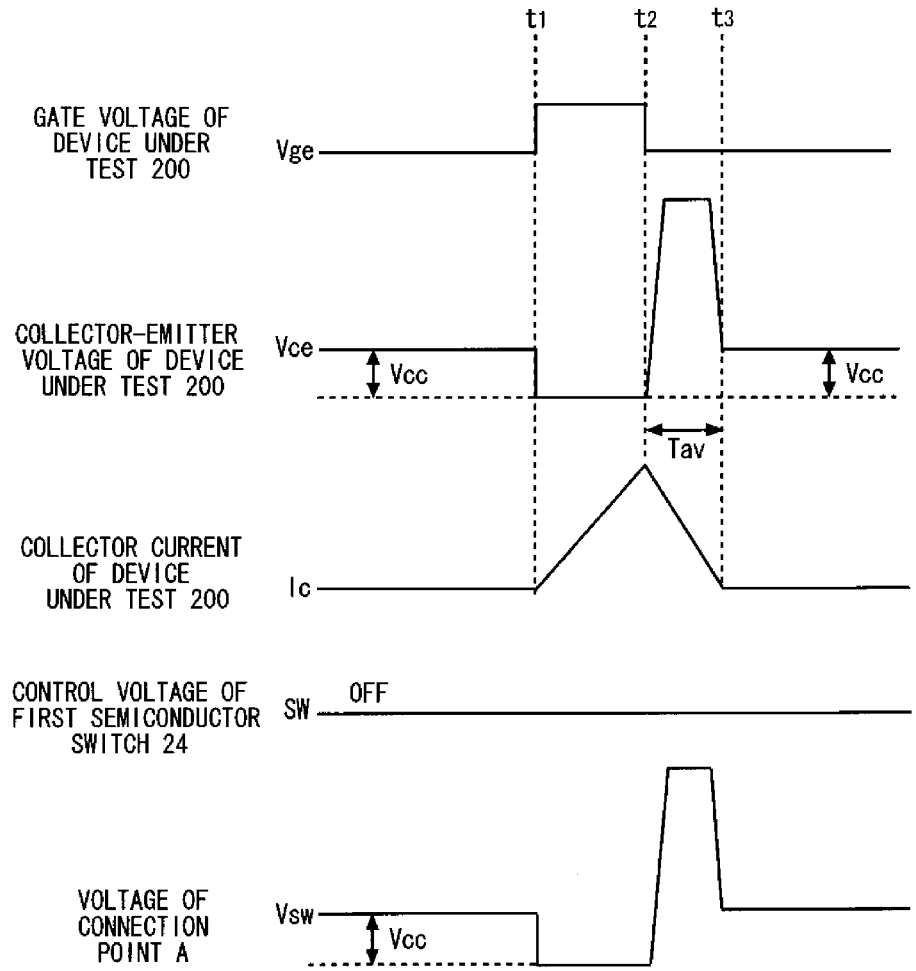
FIG. 3 shows exemplary waveforms of the gate voltage, the collector-emitter voltage, and the collector current of the device under test 200, the control signal of the first semiconductor switch 24, and the voltage of the connection point A when the device under test 200 is operating normally during testing of the avalanche breakdown voltage of the device under test 200, which is an IGBT.

FIG. 3 shows exemplary waveforms of the gate voltage, the collector-emitter voltage, and the collector current of the device under test 200, the control signal of the first semiconductor switch 24, and the voltage of the connection point A when the device under test 200 is operating normally during testing of the avalanche breakdown voltage of the device under test 200, which is an IGBT. In FIG. 3, Vge represents the gate voltage, i.e. the gate-emitter voltage, of the device under test 200, Vce represents the collector-emitter voltage of the device under test 200, Ic represents the collector current of the device under test 200, SW represents the waveform of the control signal of the first semiconductor switch 24, and Vsw represents the potential of connection point A, which is the node connected to the terminal of the inductive load section 22 on the device under test 200 side.

When testing the avalanche breakdown voltage of the device under test 200, which is an IGBT, first, the control section 10 turns OFF the device under test 200 and turns ON the second semiconductor switch 26. Furthermore, since no abnormality is detected, the control section 10 turns OFF the first semiconductor switch 24 and turns ON the third semiconductor switches 28-1 and 28-2. After the device under test 200 is turned OFF and the second semiconductor switch 26 is turned ON, the potential Vsw at the connection point A is the power supply voltage Vcc. The collector-emitter voltage Vce of the device under test 200 is also the power supply voltage Vcc.

The control section 10 keeps the second semiconductor switch 26 turned ON. Furthermore, until an abnormality is detected, the control section 10 keeps the third semiconductor switches 28-1 and 28-2 turned ON.

Next, at the time t1, the control section 10 switches the device under test 200 from OFF to ON. After the device under test 200 is turned ON at the time t1, the collector-emitter voltage Vice of the device under test 200 is a 0 potential, i.e. the ground potential. Furthermore, the potential Vsw at the connection point A is also a 0 potential, i.e. the ground potential.

After the device under test 200 is turned ON at the time t1, the collector current Ic of the device under test 200 increases at a rate corresponding to the inductance of the inductive load section 22. Energy is accumulated in the inductive load section 22 due to the power supplied from the power supply section 20.

Next, at the time t2, which is a predetermined time after the time t1, the control section 10 switches the device under test 200 from ON to OFF. When the device under test 200 is switched from ON to OFF, the current flowing through the inductive load section 22 is stopped and the inductive load section 22 generates a back electromotive force. Accordingly, after the device under test 200 is turned OFF at the time t2, the potential Vsw at the connection point A increases to a voltage obtained as the sum of the power supply potential Vcc generated from the power supply section 20 and a voltage corresponding to the back electromotive force of the inductive load section 22.

After the device under test 200 is turned OFF at the time t2, the inductive load section 22 discharges the energy accumulated from the time t1 to the time t2 as a current. The device under test 200 absorbs the current discharged from the inductive load section 22, as a result of the collector current Ic flowing.

Accordingly, after the device under test 200 is turned OFF at the time t2, the device under test 200 causes the collector current Ic to flow until all of the energy accumulated in the inductive load section 22 is discharged. The collector current Ic decreases at a rate corresponding to the inductance of the inductive load section 22. The period during which the energy accumulated in the inductive load section 22 is discharged as current is referred to as the avalanche period Tav.

Next, when all of the energy accumulated in the inductive load section 22 has been discharged (time t3), the collector current Ic becomes 0. Since the back electromotive force generated by the inductive load section 22 is also 0, the potential Vsw at the connection point A becomes the power supply voltage Vcc. Furthermore, the collector-emitter voltage Vce of the device under test 200 also becomes the power supply voltage Vcc.

The test apparatus 100 controls the device under test 200 in the manner described above during testing of the avalanche breakdown voltage. When the above operation is performed normally, i.e. when the device under test 200 does not break down due to an excessive current flowing therethrough, the test apparatus 100 judges the device under test 200 to be nondefective.

Figure 4:
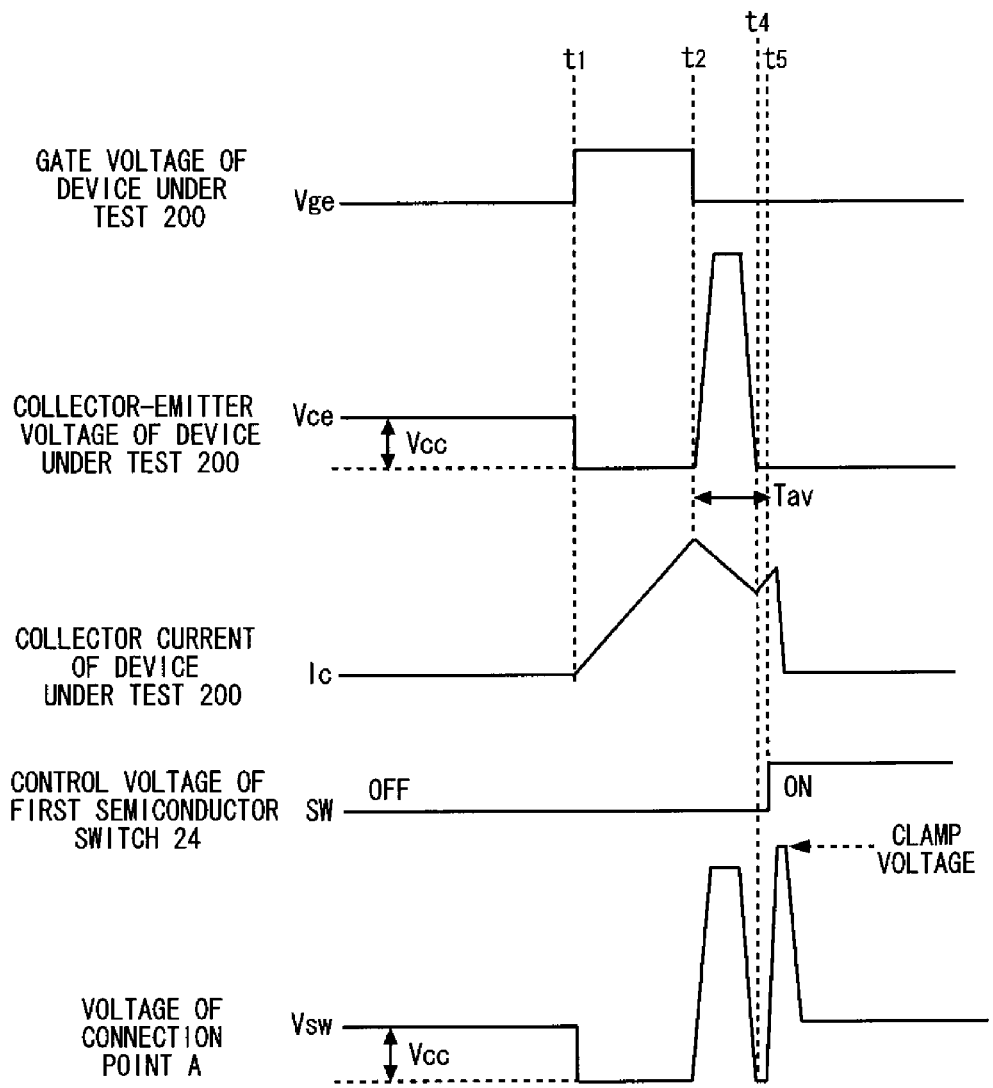
FIG. 4 shows exemplary waveforms of the gate voltage, the collector-emitter voltage, and the collector current of the device under test 200, the control signal of the first semiconductor switch 24, and the voltage of the connection point A when the device under test 200 is operating abnormally during testing of the avalanche breakdown voltage of the device under test 200, which is an IGBT.

FIG. 4 shows exemplary waveforms of the gate voltage, the collector-emitter voltage, and the collector current of the device under test 200, the control signal of the first semiconductor switch 24, and the voltage of the connection point A when the device under test 200 is operating abnormally during testing of the avalanche breakdown voltage of the device under test 200, which is an IGBT. In FIG. 4, Vge, Vce, Ic, SW, and Vsw represent the same waveforms as in FIG. 3.

Here, it is assumed that the device under test 200 malfunctions during testing. In this case, an abnormality occurs in the operation of the device under test 200.

For example, it may be assumed that the device under test 200 malfunctions in the short-circuit mode at the time t4 during the avalanche period Tav. In this case, the inductive load section 22 generates the back electromotive force, and the collector current Ic increases quickly. Furthermore, the potential Vsw at the connection point A instantly drops to the ground potential due to the short circuiting of the device under test 200, but then quickly increases until reaching the clamp voltage.

If the device under test 200 malfunctions in this way, when the collector current Ic continues flowing from the inductive load section 22 to the device under test 200, there is a high chance that the increase of the collector current Ic will cause the device under test 200 to break down. When the device under test 200 malfunctions in this way, the abnormality detecting section 30 of the present embodiment notifies the control section 10 that an abnormality has occurred. For example, the abnormality detecting section 30 may detect that the collector current Ic has increased quickly during the avalanche period, and notify the control section 10 of this.

In response to receiving the notification from the abnormality detecting section 30, the control section 10 switches the first semiconductor switch 24 from OFF to ON and switches the third semiconductor switches 28-1 and 28-2 from ON to OFF (time t5). In this way, the control section 10 can divert some of the current attempting to flow from the inductive load section 22 to the device under test 200 to the first semiconductor switch 24 instead, thereby decreasing the collector current Ic flowing through the device under test 200, and can use the third semiconductor switches 28-1 and 28-2 to prevent the collector current Ic from quickly flowing from the inductive load section 22 to the device under test 200. When stopping the supply of the power supply voltage to the device under test 200, the voltage control section 10 may turn ON the first semiconductor switch 24 after turning OFF the second semiconductor switch 26. Since the first semiconductor switch 24 and the second semiconductor switch 26 are not ON at the same time, there is no short from the inductive load section 22 to the ground potential, and therefore an excessive current can be prevented from being supplied from the power supply section 20. As a result of the above operation, the test apparatus 100 can prevent excessive current from causing the breakdown of the device under test 200 or the test apparatus 100 itself when testing the avalanche breakdown voltage of the device under test 200, which is an IGBT.

When the device under test 200 malfunctions in the open mode, the control section 10 can still switch the first semiconductor switch 24 from OFF to ON in response to receiving notification from the abnormality detecting section 30. In this way, a low collector-emitter voltage can be maintained for the device under test 200, thereby preventing the breakdown of the device under test 200 or the test apparatus 100.

Figure 5:
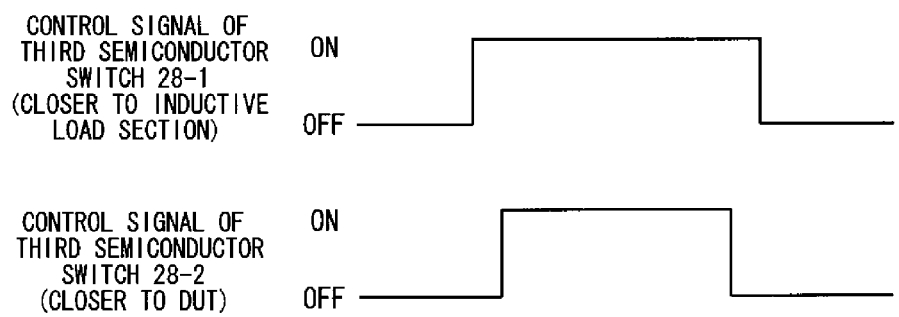
FIG. 5 shows an exemplary control signals with a changed input timing for the third semiconductor switches 28-1 and 28-2.

FIG. 5 shows exemplary control signals with changed input timings for the third semiconductor switches 28-1 and 28-2.

When turning the third semiconductor switches 28-1 and 28-2 from OFF to ON, the control section 10 may cause the input timing of each of a plurality of control signals to be later for semiconductor switches that are closer to the device under test 200. In this way, when the third semiconductor switches 28-1 and 28-2 transition from OFF to ON, the control section 10 can cause the semiconductor switch closer to the ground potential, in this case the third semiconductor switch 28-2, to be turned ON last.

When turning the third semiconductor switches 28-1 and 28-2 from ON to OFF, the control section 10 may cause the input timing of each of a plurality of control signals to be earlier for semiconductor switches that are closer to the device under test 200. In this way, when the third semiconductor switches 28-1 and 28-2 transition from ON to OFF, the control section 10 can cause the semiconductor switch closer to the ground potential, in this case the third semiconductor switch 28-2, to be turned OFF first.

When the inductive load section 22 generates an excessive voltage, the control section 10 can apply an averaged voltage to the third semiconductor switches 28-1 and 28-2, i.e. the control section 10 does not apply the excessive voltage to only one semiconductor switch, and can therefore prevent the third semiconductor switches 28-1 and 28-2 from malfunctioning.

Figure 6:
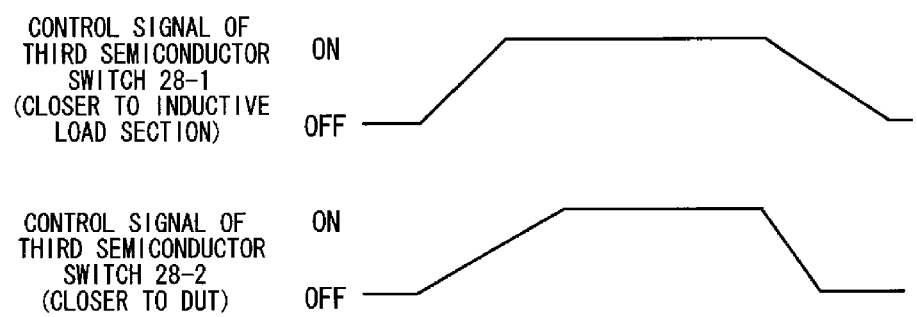
FIG. 6 shows a modification in which the rate of change of the control signals is changed respectively for the third semiconductor switches 28-1 and 28-2 when transitioning between ON and OFF.

FIG. 6 shows a modification in which the rate of change of the control signals is changed respectively for the third semiconductor switches 28-1 and 28-2 when transitioning between ON and OFF. The control section 10 may adjust the rate of change for each of a plurality of control signals, for example.

In this case, the control section 10 causes a lower rate of change for control signals corresponding to semiconductor switches closer to the device under test 200. In this way, when the third semiconductor switches 28-1 and 28-2 transition from OFF to ON, the control section 10 can cause the semiconductor switch closer to the ground potential, in this case the third semiconductor switch 28-2, to be turned ON last.

When turning the third semiconductor switches 28-1 and 28-2 from ON to OFF, the control section 10 causes a higher rate of change for control signals corresponding to semiconductor switches closer to the device under test 200. In this way, when the third semiconductor switches 28-1 and 28-2 transition from ON to OFF, the control section 10 can cause the semiconductor switch closer to the ground potential, in this case the third semiconductor switch 28-2, to be turned OFF first.

When the inductive load section 22 generates an excessive voltage, this control section 10 can apply an averaged voltage to the third semiconductor switches 28-1 and 28-2, i.e. the control section 10 does not apply the excessive voltage to only one semiconductor switch, and can therefore prevent the third semiconductor switches 28-1 and 28-2 from malfunctioning.

With the configuration described above, the supply of power to a device under test can be stopped when an abnormality, such as a prescribed current value, is detected, in order to prevent breakdown of the device under test. Furthermore, when the supply of power is stopped, an excessive current can be prevented from flowing through the device under test.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus that tests a device under test, comprising:
    a power supply section that generates a power supply voltage to be supplied to the device under test;
    an inductive load section that is provided in a path leading from the power supply section to the device under test;
    a first semiconductor switch that is provided in the path leading from the inductive load section to the device under test and is connected in parallel with the device under test; and
    a second semiconductor switch provided between the power supply section and the inductive load section; and
    a control section that performs operations according to a program, the operations including
        turning the second semiconductor switch OFF, which stops the power supply voltage from being supplied to the device under test, and
        turning the first semiconductor switch ON in response to the power supply voltage to the device under test being stopped after turning OFF the second semiconductor switch.

2. The test apparatus according to claim 1, wherein the first semiconductor switch has a larger allowable current than the device under test.

3. The test apparatus according to claim 1, wherein the first semiconductor switch has a lower ON resistance than the device under test.

4. The test apparatus according to claim 1, further comprising a discharge tube that is connected in parallel with the device under test and clamps the voltage applied to the device under test.

5. The test apparatus according to claim 1, further comprising a plurality of third semiconductor switches that are connected in series with the device under test in the path leading from the inductive load section to the device under test, wherein the control section operates according to the program to turn OFF the third semiconductor switches in response to the power supply voltage to the device under test being stopped.

6. The test apparatus according to claim 1, wherein the control section operates according to the program to stop the power supply voltage to the device under test in response to an abnormality occurring during testing.

7. The test apparatus according to claim 1, wherein the device under test and the first semiconductor switch are insulated-gate bipolar transistors.

8. The test apparatus according to claim 1, comprising:
    an image capturing section that captures an image of the device under test using a camera that detects a temperature distribution of a subject; and
    an identifying section operable to identify switching elements that are malfunctioning among a plurality of switching elements included in the device under test, based on the acquired temperature distribution.

9. The test apparatus according to claim 8, wherein the image capturing section captures an image of a wafer on which a plurality of the devices under test are formed, and the identifying section is operable to identify devices under test that include malfunctioning switching elements, based on the temperature distribution of the wafer.

10. The test apparatus according to claim 9, wherein the identifying section is operable to identify, as the malfunctioning switching elements, switching elements that are within a predetermined distance from a location at which the temperature exceeds a predetermined reference value.

11. The test apparatus according to claim 8, wherein a pad is arranged over the device under test, and malfunctioning cells are identified based on the temperature distribution indicated by an image captured through the pad.

* * * * *